United States Patent
Kondo

(10) Patent No.: US 10,379,163 B2
(45) Date of Patent: Aug. 13, 2019

(54) POWER GENERATION SYSTEM

(71) Applicant: TATSUMI RYOKI CO., LTD, Tokyo (JP)

(72) Inventor: Toyoshi Kondo, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 21 days.

(21) Appl. No.: 15/972,288

(22) Filed: May 7, 2018

(65) Prior Publication Data

US 2018/0252773 A1    Sep. 6, 2018

Related U.S. Application Data

(63) Continuation of application No. PCT/JP2017/002466, filed on Jan. 25, 2017.

(30) Foreign Application Priority Data

Feb. 25, 2016   (JP) .................................. 2016-033733

(51) Int. Cl.
*G01R 31/34*     (2006.01)
*H02K 11/20*     (2016.01)
(Continued)

(52) U.S. Cl.
CPC .......... *G01R 31/343* (2013.01); *F02B 63/044* (2013.01); *G01R 1/203* (2013.01);
(Continued)

(58) Field of Classification Search
CPC .... G01R 31/343; G01R 31/34; G01R 31/346; G01R 31/025; G01R 31/42; G01R 31/2829; G01R 31/1272; G01R 31/12
(Continued)

(56) References Cited

U.S. PATENT DOCUMENTS 2,971,596 A * 2/1961 Davis .................... B60W 10/02
                                                     123/352
4,130,794 A * 12/1978 Cox ..................... G01R 31/023
                                                     324/538
(Continued)

FOREIGN PATENT DOCUMENTS

EP          2899858 A1      7/2015
JP        H07-43436 A      2/1995
(Continued)

OTHER PUBLICATIONS

International Search Report issued in PCT/JP2017/002466 dated Mar. 7, 2017 with English Translation (5 pages).
(Continued)

*Primary Examiner* — Jermele M Hollington
*Assistant Examiner* — Taqi Nasir
(74) *Attorney, Agent, or Firm* — Nakanishi IP Associates, LLC

(57) ABSTRACT

A power generation system including a load testing device in which a configuration component is less likely to be deteriorated is provided. A power generation system includes an engine including an engine main body, a radiator that performs heat exchange of cooling water flowing inside the engine main body, and a fan that cools an radiator. A power generator that converts torque acquired in the engine main body into electricity is included. A load testing device that includes a plurality of resistors and that is used to perform a loading test of the power generator is included. A switching device that performs at least one of changing a position of the load testing device and changing a flow channel of cooling air from the fan, in order to deviate the load testing device from the flow channel or to place the load testing device in the flow channel and on a downstream side of the radiator in the loading test is included.

7 Claims, 11 Drawing Sheets

(51) Int. Cl.
*G01R 1/20* (2006.01)
*G01R 1/44* (2006.01)
*H02K 7/18* (2006.01)
*F02B 63/04* (2006.01)

(52) U.S. Cl.
CPC ............... *G01R 1/44* (2013.01); *G01R 31/34* (2013.01); *H02K 7/1815* (2013.01); *H02K 11/20* (2016.01)

(58) Field of Classification Search
USPC ...... 324/765.01, 177, 139, 143, 772, 51, 66, 324/73.1, 764.01, 762.01, 544, 548
See application file for complete search history.

(56) References Cited

U.S. PATENT DOCUMENTS

| | | | | |
|---|---|---|---|---|
| 5,181,387 | A * | 1/1993 | Meckler | F02G 1/043 62/176.1 |
| 8,050,879 | B2 * | 11/2011 | Koste | G01R 19/2506 324/66 |
| 8,788,898 | B2 * | 7/2014 | Kent | G01R 31/31857 324/764.01 |
| 2005/0114007 | A1 * | 5/2005 | Pillar | A62C 27/00 701/82 |
| 2008/0150573 | A1 * | 6/2008 | Fu | G01R 31/24 324/765.01 |
| 2011/0068818 | A1 * | 3/2011 | Fukami | G01R 31/2642 324/762.01 |
| 2012/0235566 | A1 * | 9/2012 | Karalis | H03H 7/40 315/70 |
| 2013/0169310 | A1 * | 7/2013 | Woo | G01R 31/40 324/764.01 |
| 2013/0293258 | A1 * | 11/2013 | Lechat | H02M 1/32 324/764.01 |
| 2014/0354319 | A1 * | 12/2014 | Schwartz | G01R 1/06794 324/754.05 |

FOREIGN PATENT DOCUMENTS

| | | | |
|---|---|---|---|
| JP | 2001-280585 A | 10/2001 | |
| JP | 5420782 B | 2/2014 | |
| JP | WO 2014162678 A1 * | 10/2014 | ............. F01P 11/10 |
| WO | 2014-162678 A1 | 10/2014 | |

OTHER PUBLICATIONS

Witten Opinion of International Searching Authority issued in PCT/JP2017/002466 dated Mar. 7, 2017 (4 pages).
Office Action issued in Japanese Patent Application No. 2017-536909 dated Sep. 27, 2017 with English Translation (6 pages).

* cited by examiner

POWER GENERATION SYSTEM

CROSS-REFERENCE TO RELATED APPLICATION

This application is a continuation application of International Patent Application No. PCT/JP2017/002466 filed on Jan. 25, 2017, which claims priority to Japanese Patent Application No. 2016-033733 filed on Feb. 25, 2016, the entire contents of which are incorporated by reference.

TECHNICAL FIELD

The present invention relates to a power generation system including a load testing device.

BACKGROUND ART

Conventionally, as disclosed in Patent Literature 1, a device in which a power generator and a load testing device are combined has been proposed.

CITATION LIST

Patent Literature

Patent Literature 1: Japanese Patent No. 5420782

However, since a load testing device is kept exposed to cooling air from a fan, a configuration component of the load testing device may be deteriorated.

One or more embodiments of the present invention are directed to a power generation system including a load testing device in which a configuration component is less likely to be deteriorated.

According to one or more embodiments of the present invention, a power generation system includes: an engine including an engine main body, a radiator that performs heat exchange of cooling water flowing inside the engine main body, and a fan that cools the radiator; a power generator that converts torque acquired in the engine main body into electricity; a load testing device that includes a plurality of resistors and that is used to perform a loading test of the power generator; and a switching device that performs at least one of changing a position of the load testing device and changing a flow channel of cooling air from the fan, in order to deviate the load testing device from the flow channel or to place the load testing device in the flow channel and on a downstream side of the radiator in the loading test.

Since the fan that cools the radiator of the engine can be also used for cooling of the load testing device, a configuration of a cooling member of the power generation system including the load testing device can be simplified.

Since the load testing device is deviated from the flow channel of the cooling air from the fan by the switching device in a case other than the loading test, the resistors and the like of the load testing device are not exposed to the cooling air from the fan in a case of normal use (case other than loading test).

Thus, it is possible to shorten time of exposure to hot air after cooling of the radiator and to delay deterioration of a configuration component such as the resistors of the load testing device compared to a form in which exposure to hot air after cooling of a radiator is constantly performed.

Also, since the load testing device is arranged in the flow channel of the cooling air from the fan by the switching device in the loading test, hot air after cooling of the radiator flows to the load testing device, and the resistors of the load testing device can be cooled.

Preferably, the switching device includes a guide that holds the load testing device in a slidable state in order to change a position of the load testing device.

More preferably, a power supply control unit that keeps power supply from the power generator to the load testing device when the load testing device is placed in the flow channel and on the downstream side of the radiator and that cuts off the power supply from the power generator to the load testing device when the load testing device is deviated from the flow channel is further included.

It is possible to prevent erroneous power supply to the resistors of the load testing device in a case other than the loading test.

Also, preferably, a case that houses the engine and the power generator is further included, the load testing device and the guide are arranged on an upper part of the case, and a cover that covers at least an upper surface of the load testing device when the load testing device is deviated from the flow channel is provided.

It is possible to easily add the load testing device to the case that houses the engine and the power generator and to form the power generation system.

Also, preferably, an outlet of the flow channel includes a first outlet not facing the load testing device and a second outlet facing the load testing device, and the switching device includes a flow channel switching plate that shields one of the first outlet and the second outlet and that opens the other in order to change the flow channel.

More preferably, a case that houses the engine and the power generator is further included, the first outlet is provided in an upper opening of the case, the second outlet is provided in a front opening of the case, the flow channel switching plate is arranged on the upper opening in a case where the first outlet is shielded and the second outlet is opened, and the flow channel switching plate is arranged between the front opening and the load testing device in a case where the second outlet is shielded and the first outlet is opened.

Also, preferably, a power supply control unit that keeps power supply from the power generator to the load testing device when the flow channel switching plate opens the second outlet and that cuts off the power supply from the power generator to the load testing device when the flow channel switching plate shields the second outlet is further included.

As described above, according to one or more embodiments of the present invention, it is possible to provide a power generation system including a load testing device in which a configuration component is less likely to be deteriorated.

DESCRIPTION OF EMBODIMENTS

Figure 1:
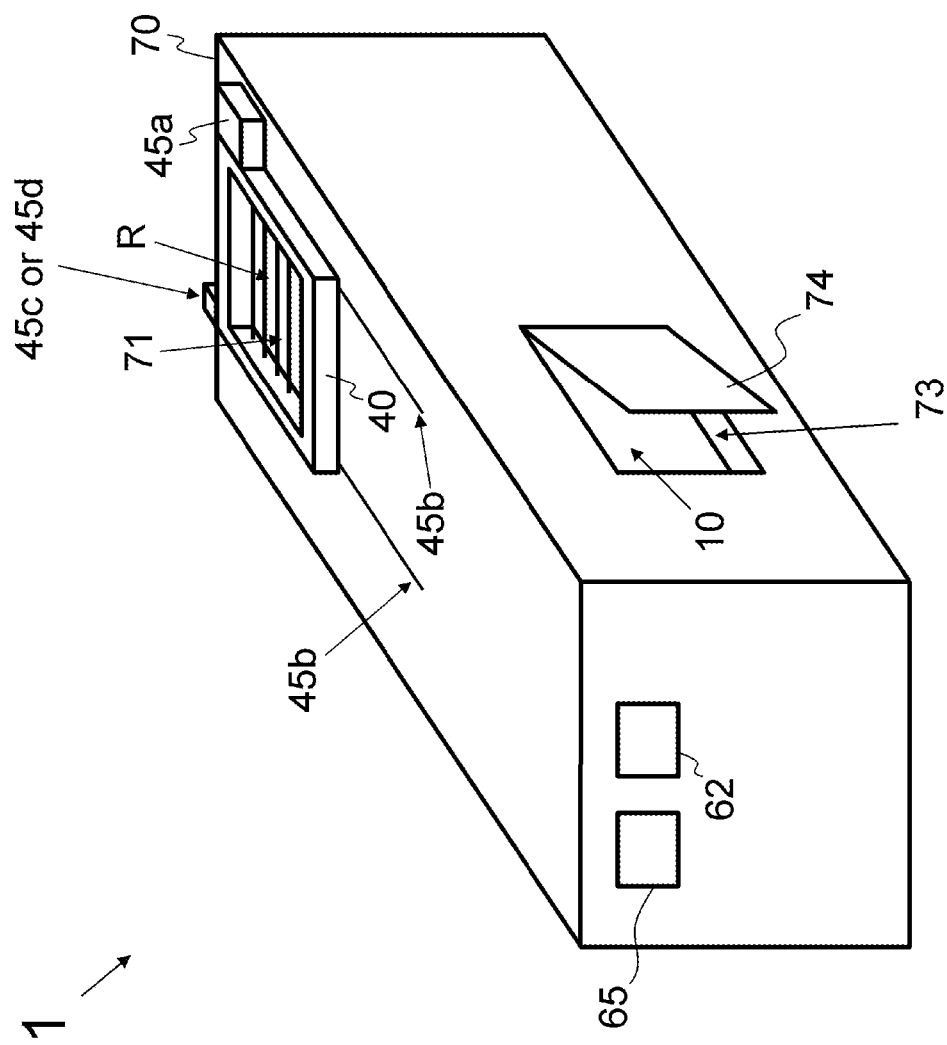
FIG. 1 is a perspective view illustrating a configuration of a power generation system in a loading test in a first embodiment.

In the following, the present embodiment will be described with reference to the drawings. A power generation system 1 in the first embodiment includes an engine 10, a power generator 20, a duct 30, a load testing device 40, a switching device (state switching device) 45, an electric storage device 50, a control unit 61, an operation unit 62, a measurement unit 63, a temperature sensor 64, a display unit 65, a communication unit 66, and a case 70 (see FIG. 1 to FIG. 8).

Figure 2:
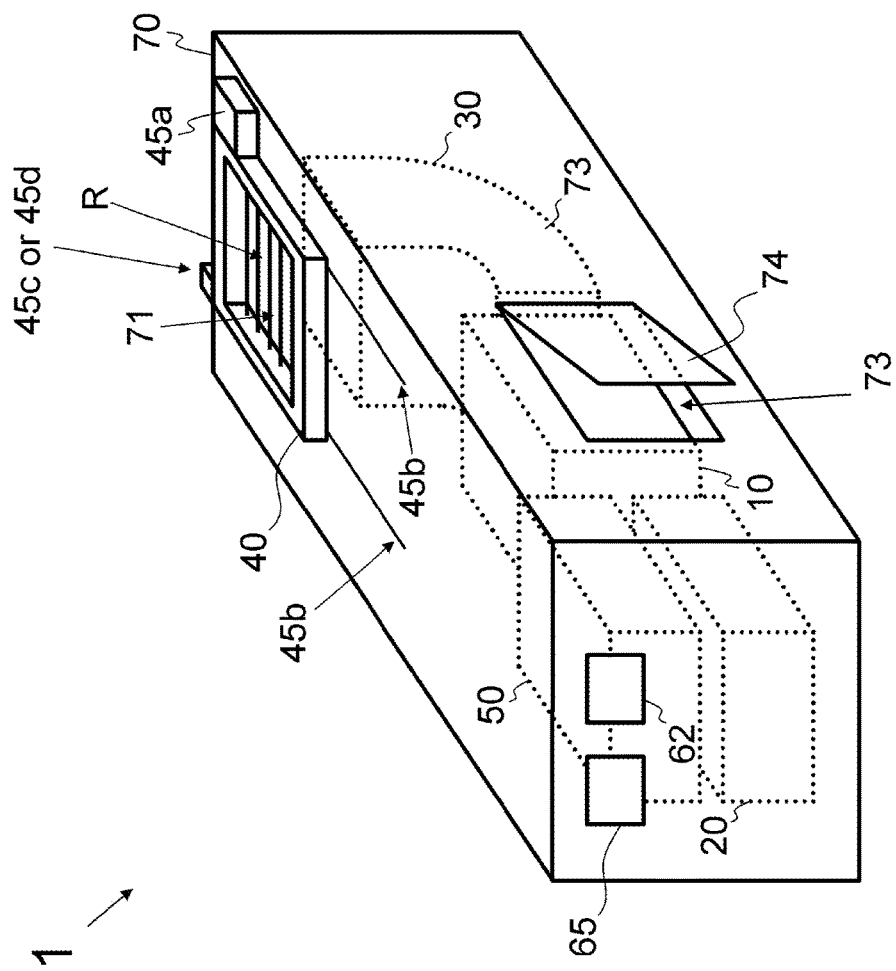
FIG. 2 is a perspective view illustrating the power generation system in the loading test in the first embodiment, an inner member being indicated by a dotted line.
Figure 5:
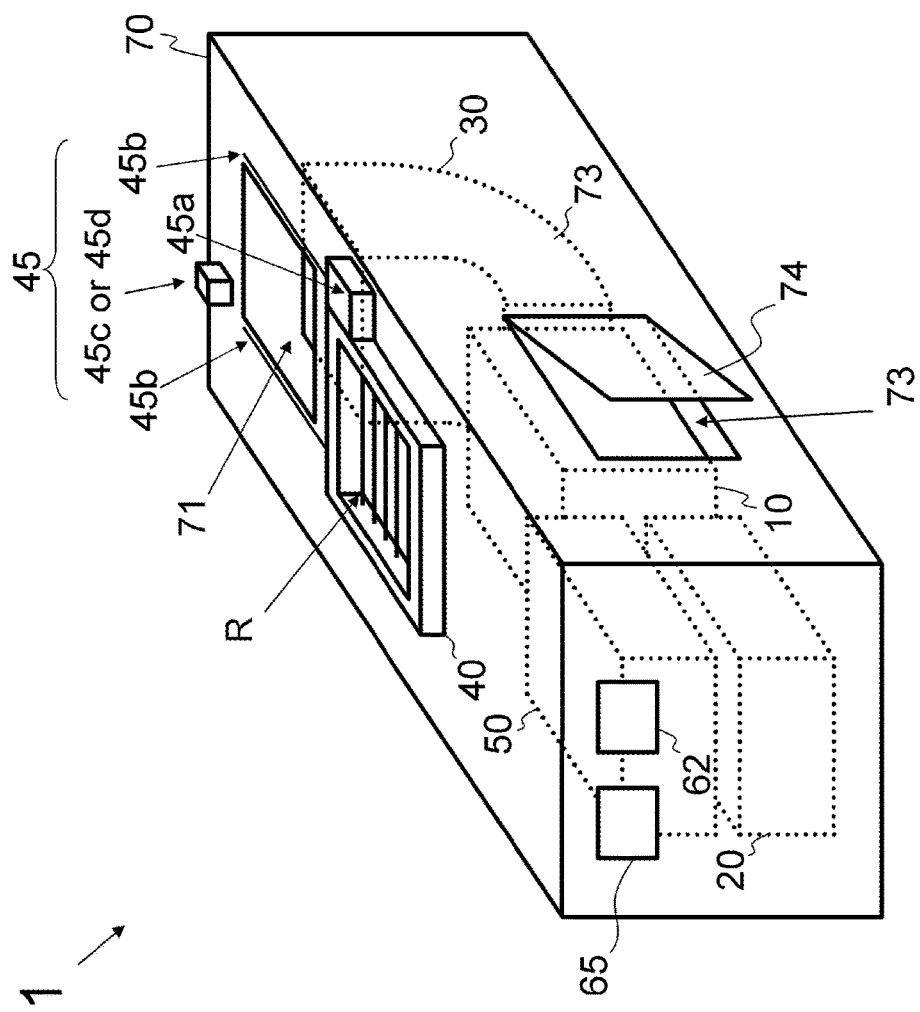
FIG. 5 is a perspective view illustrating the power generation system in a case other than the loading test in the first embodiment, an inner member being indicated by a dotted line.

Note that in the perspective views of FIG. 2 and FIG. 5, a device housed in the case 70 such as the power generator 20 is indicated by a dotted line. However, illustration of the control unit 61, the measurement unit 63, the temperature sensor 64, and the communication unit 66 is omitted.

The engine 10 is a device that generates torque by explosive power of gas such as gasoline and that gives the torque to the power generator 20, and includes an engine main body 11, a radiator 13 that performs heat exchange of cooling water flowing inside the engine main body 11, a fan 15 that cools the radiator 13, an emission gas tube 17, and a muffler 18.

A water jacket is provided in a cylinder block and a cylinder head around a combustion chamber of the engine main body 11. With cooling water passing through the water jacket, heating of the engine main body 11 by combustion can be controlled. The cooling water heated by passage through the water jacket is cooled by an air blow from the fan 15 when passing through (radiator core of) the radiator 13. The cooling water is circulated inside the water jacket and the radiator 13 by a water pump (not illustrated).

The fan 15 is a device that delivers cooling air to the radiator 13, and may be driven by the torque generated in the engine main body 11 or driven by an electric motor (not illustrated).

In the first embodiment, in addition to cooling of the radiator 13, the fan 15 is used for cooling of a resistor R of the load testing device 40 that is arranged downstream of the radiator 13 and in a flow channel of the cooling air flowing from the fan 15 in a loading test.

The radiator 13 is arranged in a side part of the engine main body 11 in such a manner that a surface of the radiator core facing the fan 15 becomes substantially vertical to a horizontal direction. The fan 15 is arranged between the engine main body 11 and the radiator 13 in such a manner that air is blown laterally toward the radiator core of the radiator 13.

The emission gas tube 17 is extended toward an opening (upper opening 71) provided in an upper part of the case 70. The emission gas tube 17 is a guide channel that makes emission gas, which is emitted from the engine main body 11, emit from the upper part of the case 70 to the outside.

The muffler 18 that reduces emission sound is provided in the guide channel.

The power generator (electric generator) 20 is a device that converts torque acquired in the engine main body 11 into electricity. Power acquired by power generation is supplied to an external electric device connected to the power generator 20 or stored in the electric storage device 50.

When a loading test is performed, the power generator 20 is electrically connected to the load testing device 40, and electrical connection to the external electric device is cut off.

The duct 30 is a guide channel in which a flow channel is substantially L-shaped when seen from the side and which guides a lateral air blow from the fan 15 to an upper direction, an inlet thereof facing the radiator core of the radiator 13 and an outlet thereof facing the upper opening 71.

In the load testing device 40, an upper surface and a lower surface are opened, and a resistor group in which a plurality of rod resistors R parallel to the horizontal direction is lined up at predetermined intervals and connected in series is lined up for one stage or more in a vertical direction. The load testing device 40 is used to perform a loading test of the power generator 20.

Figure 3:
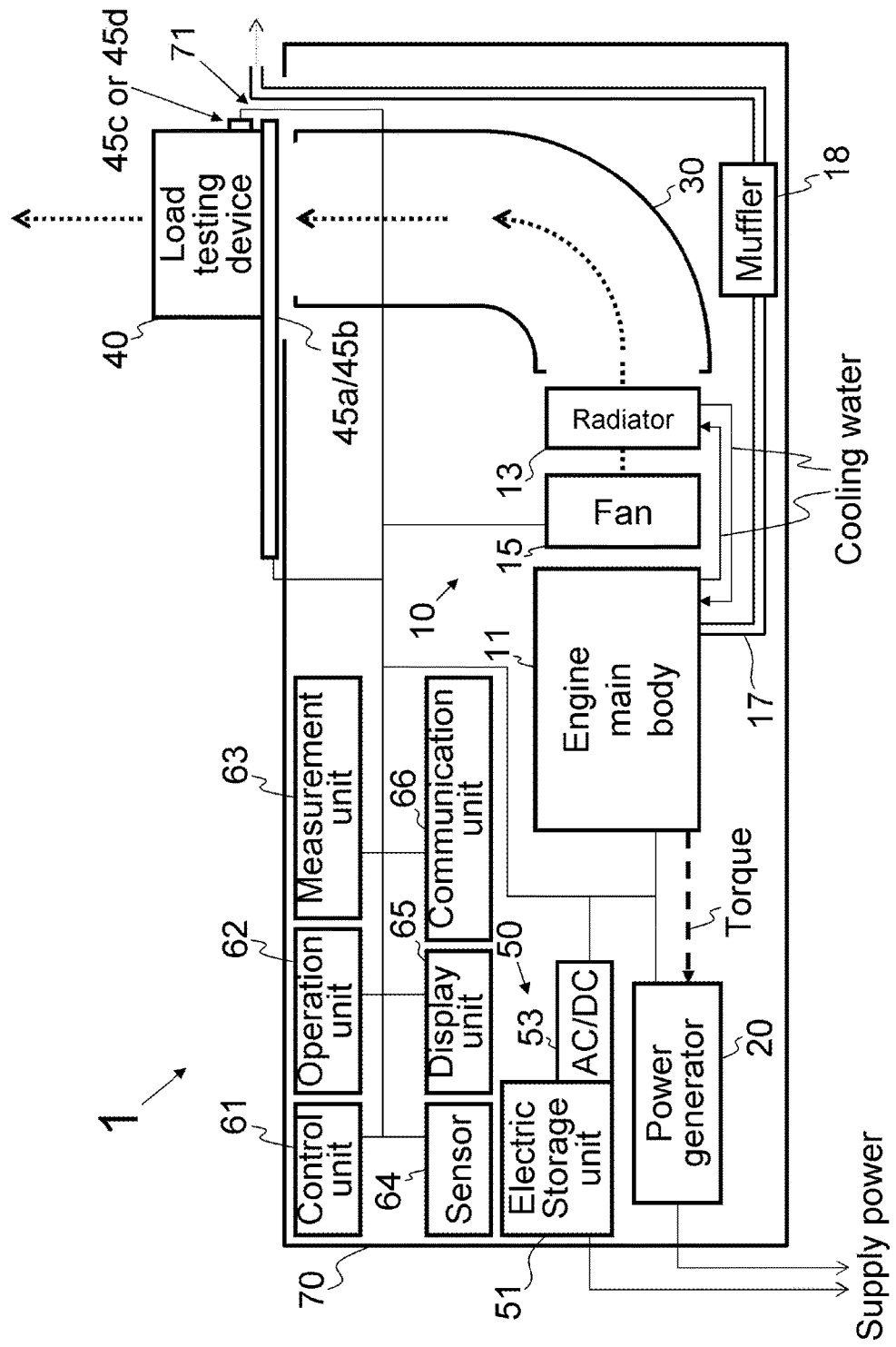
FIG. 3 is a schematic view illustrating the configuration of the power generation system in the loading test in the first embodiment.

In the first embodiment, in a loading test, the load testing device 40 is moved by the switching device 45 in such a manner that the resistors R of the load testing device 40 are placed at a first position that is in the flow channel of the cooling air from the fan 15 and that is on a downstream side of the radiator 13 (see FIG. 1 to FIG. 3).

Figure 4:
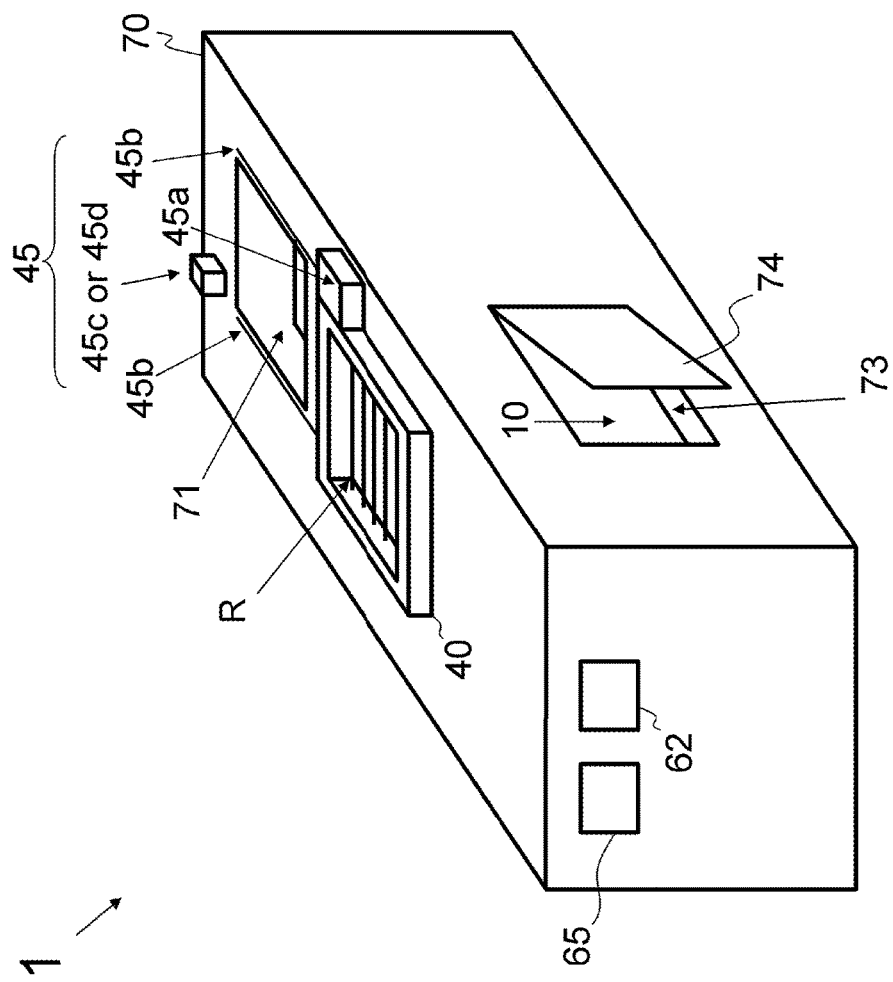
FIG. 4 is a perspective view illustrating a configuration of the power generation system in a case other than the loading test in the first embodiment.
Figure 6:
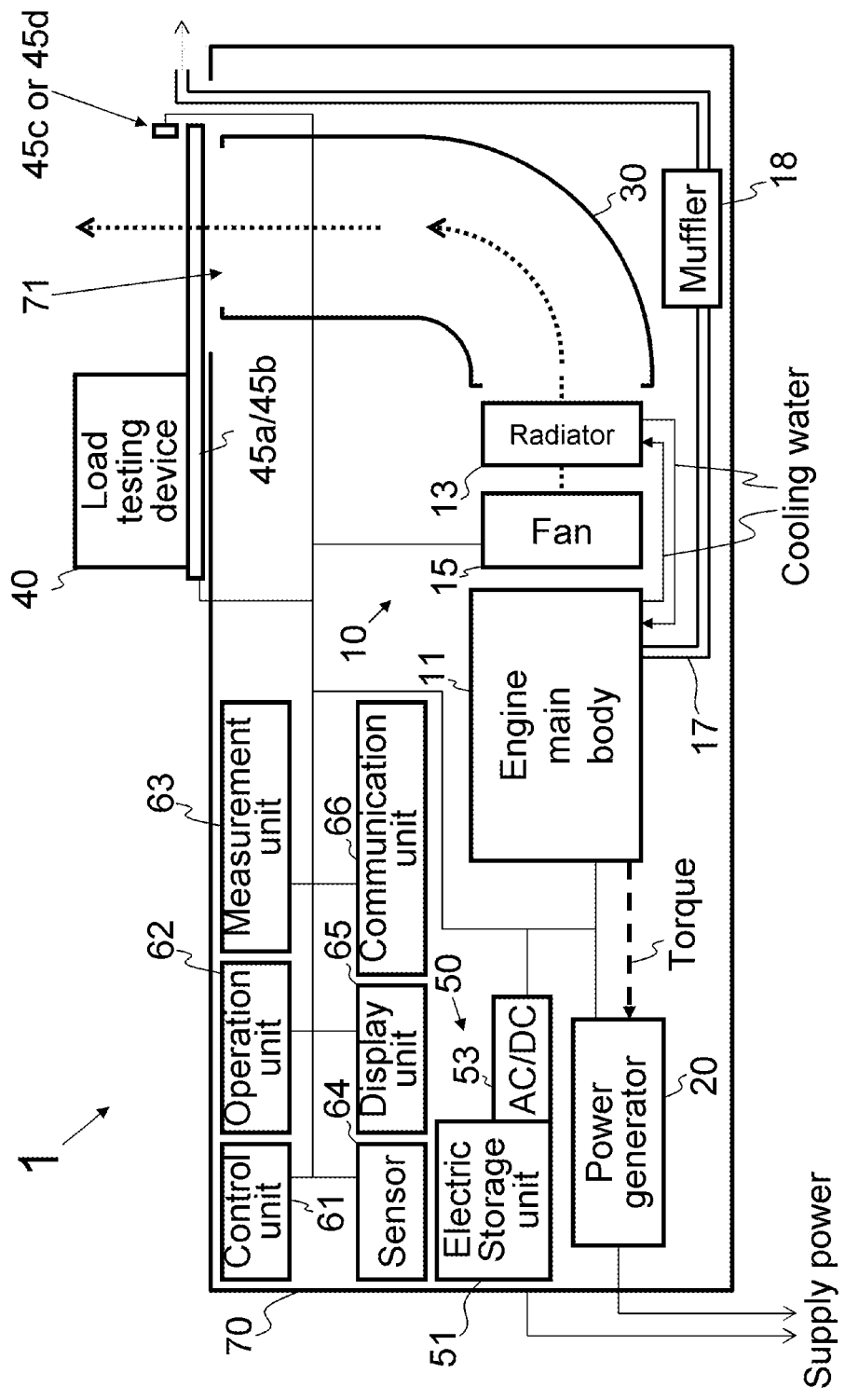
FIG. 6 is a schematic view illustrating the configuration of the power generation system in a case other than the loading test in the first embodiment.

Also, in a case other than the loading test, the load testing device 40 is moved by the switching device 45 in such a manner that the load testing device 40 is placed at a second position deviated from the flow channel (see FIG. 4 to FIG. 6).

As illustrated, the load testing device 40 may be arranged on an upper surface of the case 70 or may be arranged at a position that is inside the case 70 and is close to the upper surface.

Figure 7:
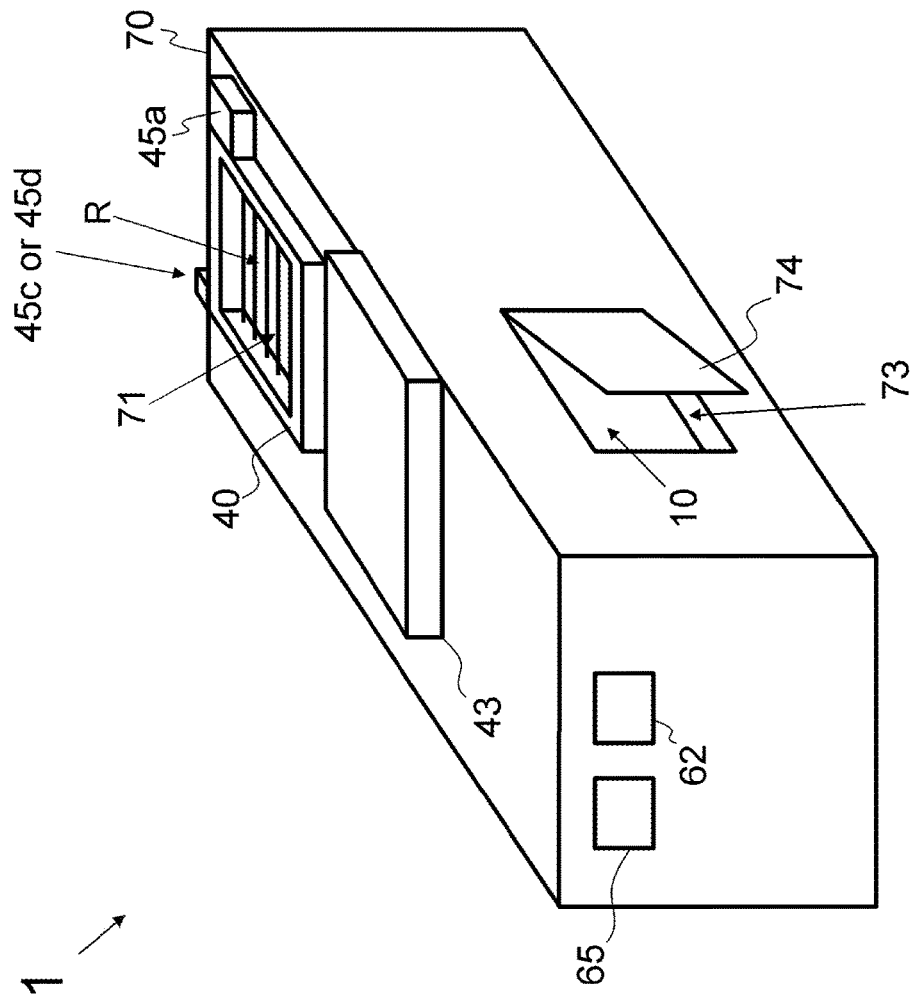
FIG. 7 is a perspective view illustrating a configuration of a power generation system with a cover in a loading test in the first embodiment.
Figure 8:
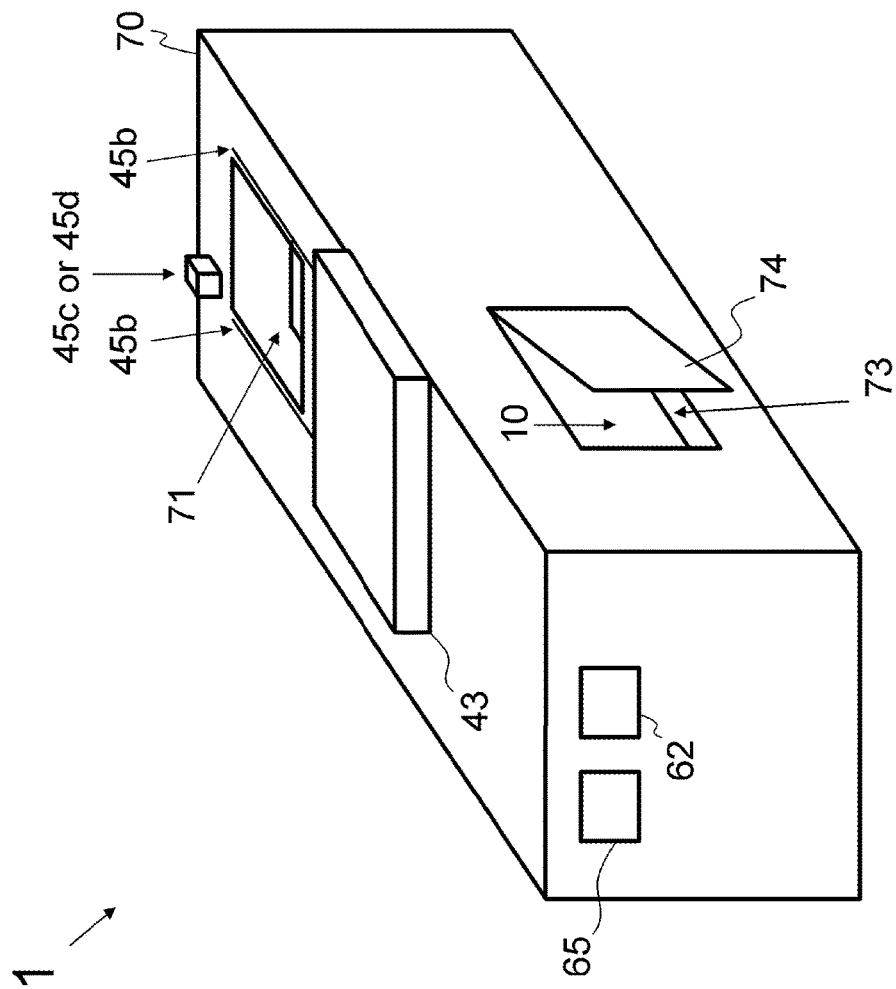
FIG. 8 is a perspective view illustrating a configuration of the power generation system with the cover in a case other than the loading test in the first embodiment.

In a case where the load testing device 40 is arranged on the upper surface of the case 70, a cover 43 that covers the load testing device 40 is preferably provided in such a manner that the resistors R and the like are not weathered in a case other than the loading test (see FIG. 7 and FIG. 8).

A capacity of the load testing device 40 is at least 25% or more of the rated output of the power generator 20 and is preferably 70% or less. For example, in a case where the rated output of the power generator 20 is 35 kVA, the load testing device 40 preferably has a capacity of 8.75 to 24.5 kW.

The switching device 45 is a device used to deviate the load testing device 40 from the flow channel of the cooling air from the fan 15 or to place the load testing device 40 in the flow channel and on the downstream side of the radiator 13. In the first embodiment, the switching device 45 includes an actuator 45a that moves the load testing device 40 in the horizontal direction on the case 70, and a guide 45b that includes a rail, a groove, or the like and that holds the load testing device 40 slidably in the horizontal direction.

In the loading test, the load testing device 40 is moved by the actuator 45a to a position facing the upper opening 71, that is, the first position in the flow channel of the cooling air from the fan 15 (see FIG. 1 to FIG. 3).

In a case other than the loading test, the load testing device 40 is moved by the actuator 45a to a position not facing the upper opening 71, that is, the second position deviated from the flow channel of the cooling air from the fan 15 (see FIG. 4 to FIG. 6).

A power supply control unit that keeps power supply from the power generator 20 to the load testing device 40 when the load testing device 40 is placed in the flow channel and on the downstream side of the radiator 13 and that cuts off the power supply from the power generator 20 to the load testing device 40 when the load testing device 40 is deviated from the flow channel is preferably provided to prevent erroneous power supply to the resistors R of the load testing device 40 in a case other than the loading test.

As the power supply control unit, a first terminal unit 45c that is connected to the power generator 20 and is arranged in the vicinity of the upper opening 71 or the like and that comes into contact with the load testing device 40 and is electrically connected to the resistors R of the load testing device 40 when the load testing device 40 is placed at the first position is considered. The power generator 20 and the load testing device 40 are electrically connected to each other via the first terminal unit 45c.

When the load testing device 40 is deviated from the flow channel, the load testing device 40 loses contact with the first terminal unit 45c, and electrical connection between the power generator 20 and the load testing device 40 is released.

In one or more embodiments, a position detection sensor 45d detects whether the load testing device 40 is at the first position, and the control unit 61 makes the power generator 20 supply power to the resistors R of the load testing device 40 only when it is detected by the position detection sensor 45d that the load testing device 40 is at the first position. In such control structure(s), the control unit 61 functions together with the detection sensor 45d as the power supply control unit.

Note that in the first embodiment, a form in which the load testing device 40 is automatically moved to the first position or the second position by the actuator 45a has been described. However, no actuator 45a may be provided and the load testing device 40 may be moved to the first position or the second position manually by a user.

The electric storage device 50 includes an electric storage unit 51 and an AC/DC converter 53. The electric storage unit 51 is a device that is connected to the power generator 20 via the AC/DC converter 53 and that is, for example, a battery or a capacitor that stores power acquired in the power generator 20. The stored power is supplied to each unit of the power generation system 1 or the external electric device connected to the electric storage device 50.

Note that the electric storage device 50 may be connected to an AC power supply (not illustrated) and used as an emergency power supply.

The control unit 61 is a control device that performs operation control of each unit of the power generation system 1 (such as operation control of engine 10 or power generator 20, control of each unit of load testing device 40, operation control of actuator 45a, and power storage control of electric storage device 50).

When a loading test is performed, the control unit 61 drives the engine main body 11 and the fan 15. To do so, the control unit 61 performs switch control of electrically connecting the resistors R of the load testing device 40 and the power generator 20 and moving control of driving the actuator 45a for moving the load testing device 40 to the first position. Note that cooling water preferably circulates inside the engine main body without passing through the radiator 13 until a temperature of the cooling water becomes equal to or higher than a predetermined temperature.

When a loading test is performed (while the engine 10 and the power generator 20 are driven), the fan 15 is used not only for cooling of the radiator 13 but also for cooling of the resistors R of the load testing device 40. Thus, in a case where a rotating speed can be controlled, for example, when driving is performed by an electric motor, the fan 15 is preferably driven at a larger output (higher rotating speed) rather than that of a case where the loading test is not performed (while the engine 10 and the power generator 20 are driven).

However, cooling water passing through the radiator core of the radiator 13 is around 80° C. at a maximum and is lower than a temperature of the resistors R of the load testing device 40 (around 200° C.). Thus, even when output control of the fan 15 is not performed, the resistors R of the load testing device 40 can be cooled by the air after heat exchange in the radiator 13.

The operation unit 62 is used to perform on/off operation of the engine 10 and the power generator 20, on/off operation of a loading test of the power generator 20 by the load testing device 40, and setting of a load or a date and time of the loading test.

The measurement unit 63 is connected to the power generator 20, and measures the number of times of performance of a loading test of the power generator 20 by the load testing device 40, a measured load actually applied to the power generator 20 by application of a predetermined load (such as 30% of rated output of power generator 20) to the power generator 20 in the loading test, and a period in which the measured load is equal to or higher than the predetermined load in the loading test. A result of the measurement is displayed on the display unit 65. Also, the result of the measurement may be transmitted to an external device via the communication unit 66 or may be recorded in a recording unit (not illustrated).

When a loading test is performed, the temperature sensor 64 measures a peripheral temperature of the engine 10 or the power generator 20 and outputs the temperature to the control unit 61. In a case where the peripheral temperature is higher than a threshold (such as temperature corresponding to condition in loading test which condition is determined by law such as fire defense law (such as 40° C.)), the control unit 61 increases an output (rotating speed) of the fan 15 in such a manner that the peripheral temperature becomes lower. In a case where the peripheral temperature is still not equal to or lower than the threshold, the control unit 61 stops the loading test and displays a warning on the display unit 65.

Also, a different temperature sensor (not illustrated) may be provided in the vicinity of the load testing device 40. In a case where a peripheral temperature of the load testing device 40 does not become lower than a constant value (such as 200° C.) even by cooling by the fan 15 or the like, the control unit 61 may stop the loading test and display a warning on the display unit 65.

The display unit 65 displays an operation state of the engine 10, the power generator 20, and the load testing device 40 and specifically displays information related to a loading test such as a measurement result by the measurement unit 63 or a peripheral temperature of the engine 10 or the power generator 20 by the temperature sensor 64.

The communication unit 66 is a device that performs transmission/reception of a signal to/from a device outside of the power generation system 1 (such as computer used to manage power generation system 1) via a network, and transmits information related to a loading test of the power generator 20 to the external device or receives information related to on/off operation of a loading test or setting of a date and time of the loading test from the external device.

The case 70 is a chassis that covers (at least upper surface, side surface, front surface, and back surface of) a member such as the load testing device 40 which member is included in the power generation system 1, and the operation unit 62 and the display unit 65 is provided on a back surface thereof.

Also, in the case 70, the upper opening 71 is provided in an upper surface and on an upper side of an outlet of the duct 30. A slit-shaped lid (not illustrated) is preferably provided in the upper opening 71 in such a manner that ingress of rainwater becomes less likely.

A flow channel in the duct 30 and the upper opening 71 of the case 70 are preferably wider than a region in which the resistors R of the load testing device 40 are lined up in order to make it easier for cooling air to pass through (to make resistor R of load testing device 40 less likely to block passage of cooling air) in a case where the cooling air passes through the load testing device 40 via the duct 30.

Also, a side opening 73 is provided in a side surface of the case 70 and in a side part of the engine main body 11, the fan 15, or the power generator 20. A door 74 is provided in the side opening 73.

Also, a door (not illustrated) is provided in a back surface of the case 70 (side on which electric storage device 50 and power generator 20 are provided). The electric storage device 50 and the power generator 20 are connected to the external electric device via the door.

The operation unit 62 and the display unit 65 may be provided in the back surface of the case 70 and on an inner side of the door.

In the first embodiment, since the fan 15 that cools the radiator 13 of the engine 10 can be also used for cooling of the load testing device 40, a configuration of a cooling member of the power generation system 1 including the load testing device 40 can be simplified.

Since the load testing device 40 is arranged at the second position deviated from the flow channel of the cooling air from the fan 15 by the switching device 45 in a case other than a loading test, the resistors R and the like of the load testing device 40 are not exposed to the cooling air from the fan 15 in a case of normal use (case other than loading test).

Thus, it is possible to shorten time of exposure to hot air after cooling of the radiator 13 and to delay deterioration of a configuration component such as the resistors R of the load testing device 40 compared to a form in which exposure to hot air after cooling of the radiator 13 is constantly performed.

Also, since the load testing device 40 is arranged at the first position in the flow channel of the cooling air from the fan 15 by the switching device 45 in a loading test, hot air after cooling of the radiator 13 flows to the load testing device 40 and can cool the resistors R of the load testing device 40.

Also, since hot air after heat exchange in the radiator 13 and the load testing device 40 is emitted to an upper side from the upper opening 71 of the case 70, it is possible to prevent the hot air from hitting a user.

Also, it becomes possible to emit emission gas of the engine main body 11 from the upper opening 71.

Also, since it is possible to introduce outside air from the upper opening 71 or the side opening 73, it becomes possible to control an increase in a peripheral temperature of the engine 10 or the power generator 20.

Also, since the engine 10, the power generator 20, and the load testing device 40 are housed in one chassis (case 70), an optimal engine 10 and load testing device 40 in a minimum size (dimension or capacity) can be combined according to performance of the power generator 20.

Specifically, a minimum load testing device 40 necessary for performing a loading test with a load of a predetermined rate (such as 25% to 70%) with respect to the rated output of the power generator 20 can be combined.

Also, since the engine 10, the power generator 20, and the load testing device 40 are housed in one chassis (case 70), when these are controlled by the control unit 61, it becomes possible to automatically drive the engine 10 and the power generator 20, perform a loading test via the load testing device 40, display a result thereof on the display unit 65, transmit the result to the external device via the communication unit 66, and to control the loading test from the external device. Also, it can be easily performed to prevent falsification of the loading test.

Specifically, in a case where the load testing device 40 is arranged on an upper surface of the case 70, it is possible to easily add the load testing device 40 to the case 70 housing the engine 10 and the power generator 20 and to form the power generation system 1 in the first embodiment.

In the first embodiment, a form of deviating the load testing device 40 from the flow channel of the cooling air from the fan 15 or placing the load testing device 40 in the flow channel and on the downstream side of the radiator 13 by changing a position of the load testing device 40 with the switching device 45 (such as guide 45b) has been described. However, a form of deviating a load testing device 40 from a flow channel of cooling air from a fan 15 or placing the load testing device 40 in the flow channel and on a downstream side of a radiator 13 by changing the flow channel with a different switching device 45 (flow channel switching plate 45e) may be included (second embodiment, see FIG. 9 to FIG. 11).

In a load testing device 40 in the second embodiment, side surfaces are opened, and a resistor group in which a plurality of rod resistors R parallel to a horizontal direction is lined up at predetermined intervals and connected in series is lined up for one stage or more in a different horizontal direction (longitudinal direction of getting away from case 70). The load testing device 40 is used to perform a loading test of a power generator 20 and is fixed to an upper side of a front surface of the case 70.

In the case 70 in the second embodiment, an upper opening 71 is provided and a front opening 72 is provided in a part, which faces the load testing device 40, in the front surface.

A duct 30 in the second embodiment is a guide channel in which a flow channel is substantially L-shaped when seen from the side and which guides a lateral air blow from a fan 15 to an upper direction, an inlet thereof facing a radiator core of a radiator 13, one outlet (first outlet) thereof facing the upper opening 71, and the other outlet (second outlet)

thereof facing the front opening 72 (load testing device 40 provided in front surface of case 70).

A switching device 45 in the second embodiment includes a flow channel switching plate 45e that shields one of the first outlet and the second outlet and that opens the other.

Figure 11:
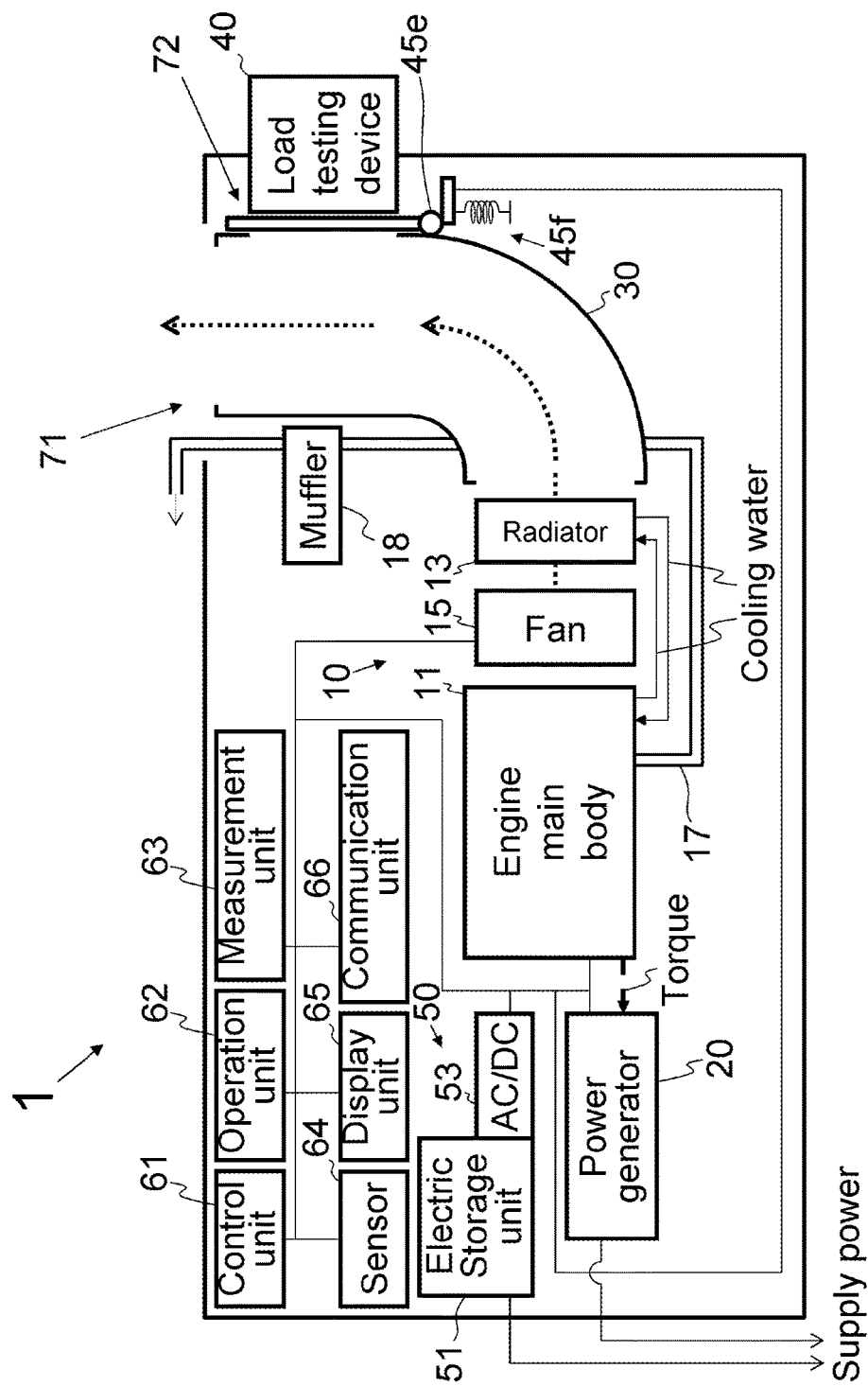
FIG. 11 is a schematic view illustrating a configuration of the power generation system in a case other than the loading test in the second embodiment.

The flow channel switching plate 45e is arranged in such a manner as to be placed in one outlet (first outlet not facing load testing device 40) of the duct 30 in a loading test (first state, see FIG. 9) and is arranged in such a manner as to be placed between the other outlet (second outlet facing load testing device 40) of the duct 30 and the load testing device 40 in a case other than the loading test (second state, see FIG. 11).

Figure 9:
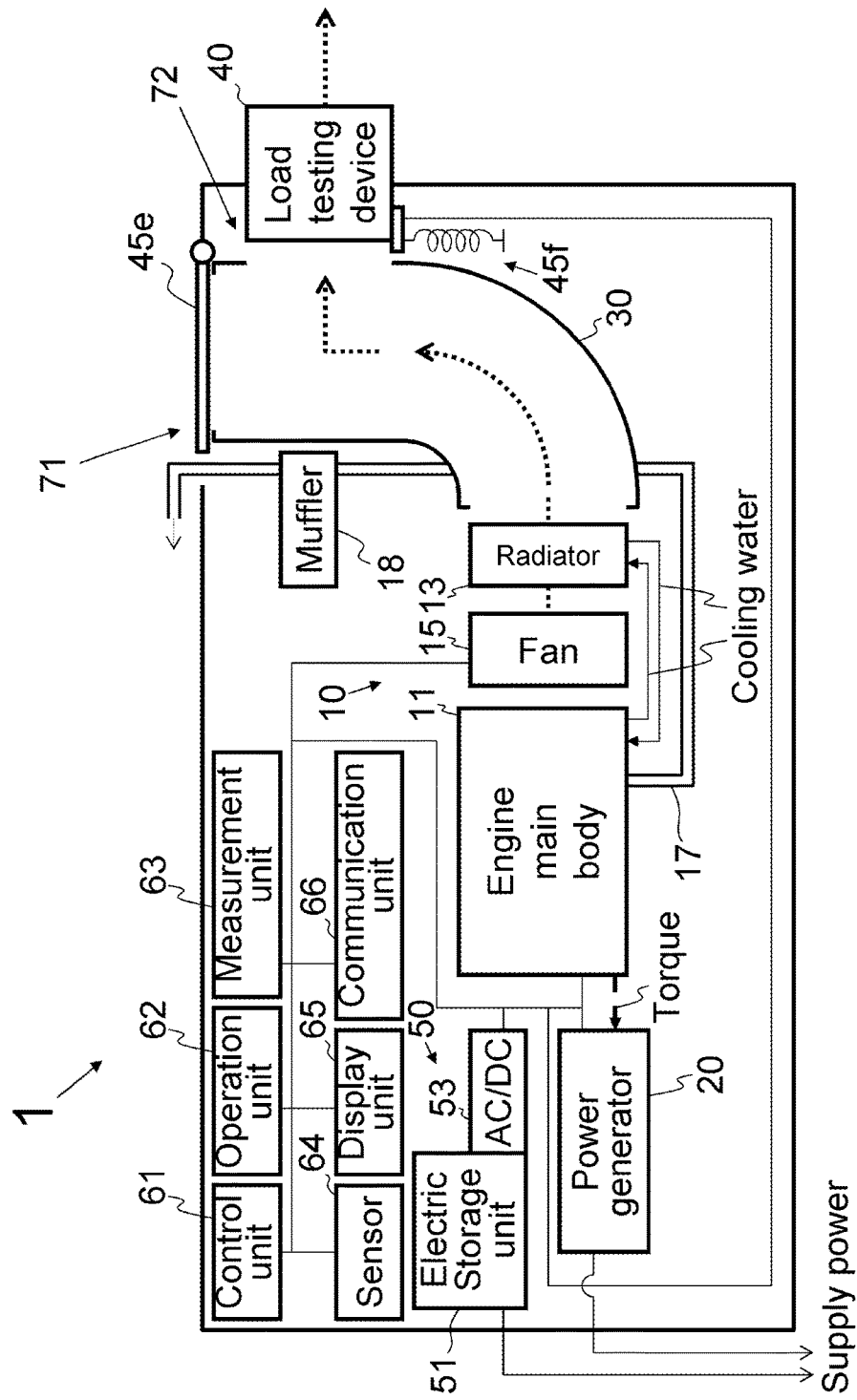
FIG. 9 is a schematic view illustrating a configuration of a power generation system in a loading test in a second embodiment.
Figure 10:
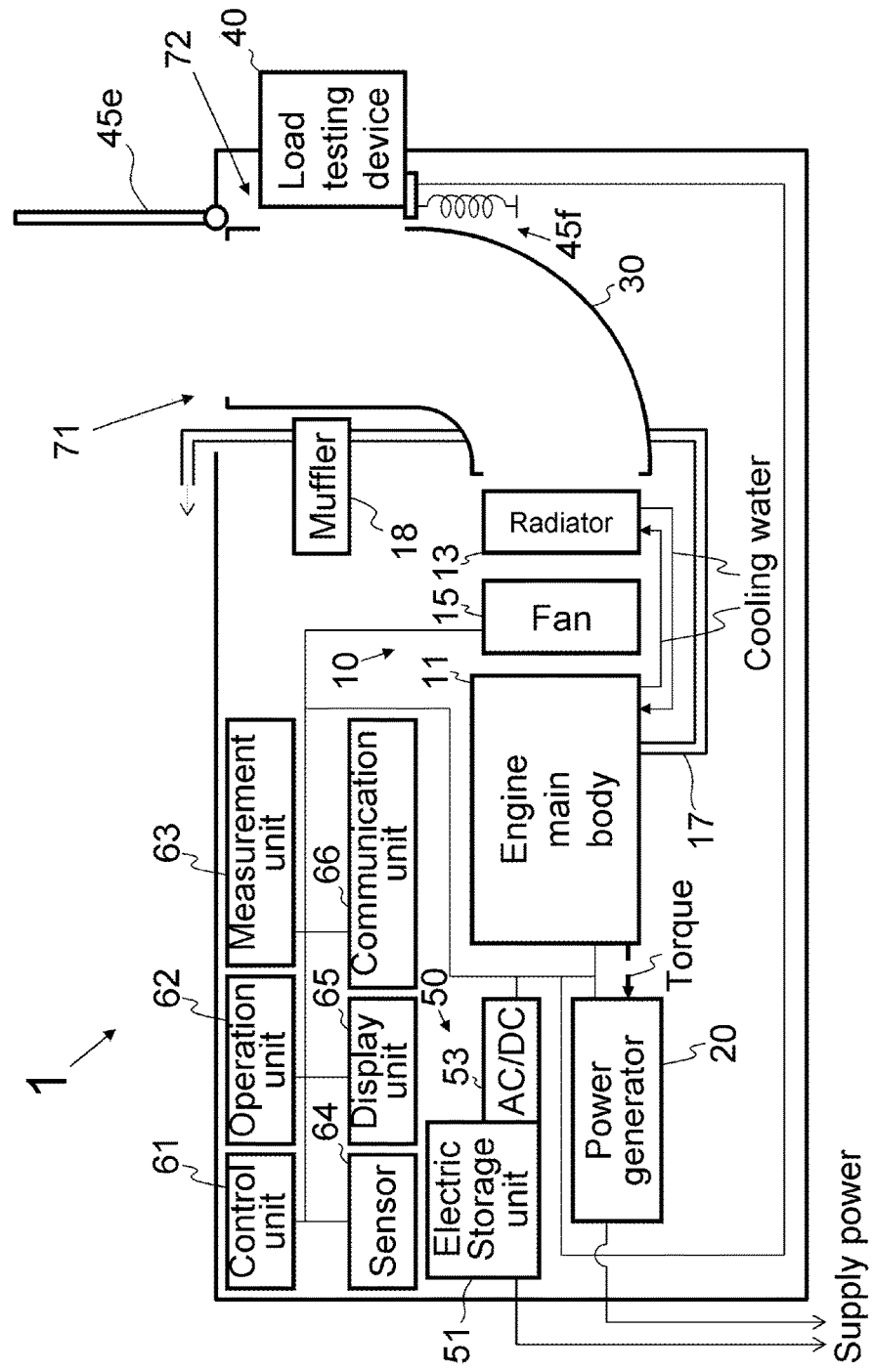
FIG. 10 is a schematic view illustrating a configuration in a halfway stage of switching a first state and a second state in the power generation system in the second embodiment.

The flow channel switching plate 45e is rotated from the first state (see FIG. 9) and an end part on an opposite side of a rotation axis is lifted to an upper side (see FIG. 10). Then, the flow channel switching plate 45e is lowered to a lower side and switched to the second state (see FIG. 11).

Also, the flow channel switching plate 45e is lifted from the second state (see FIG. 11) to the upper side (see FIG. 10), and then rotated and switched to the first state (see FIG. 9).

However, the first state and the second state of the flow channel switching plate 45e may be switched by a different method.

Since the other outlet (second outlet, front opening 72) of the duct 30 is shielded and the one outlet (first outlet, upper opening 71) of the duct 30 is opened with the flow channel switching plate 45e in a case other than the loading test, the load testing device 40 is deviated from a flow channel of cooling air from the fan 15 and the resistors R and the like of the load testing device 40 are not exposed to the cooling air from the fan 15 in a case of normal use (case other than loading test).

Thus, it is possible to shorten time of exposure to hot air after cooling of the radiator 13 and to delay deterioration of a configuration component such as the resistors R of the load testing device 40 compared to a form in which exposure to hot air after cooling of the radiator 13 is constantly performed.

Also, since the one outlet (first outlet, upper opening 71) of the duct 30 is shielded and the other outlet (second outlet, front opening 72) of the duct 30 is opened with the flow channel switching plate 45e in the loading test, the load testing device 40 is placed in a flow channel of cooling air from the fan 15. Thus, hot air after cooling of the radiator 13 flows to the load testing device 40 and the resistors R of the load testing device 40 can be cooled.

The first state and the second state of the flow channel switching plate 45e may be switched manually or may be switched automatically by an actuator (not illustrated) or the like.

A power supply control unit that keeps power supply from the power generator 20 to the load testing device 40 when the flow channel switching plate 45e opens the other outlet (second outlet, front opening 72) of the duct 30 and that cuts off the power supply from the power generator 20 to the load testing device 40 when the flow channel switching plate 45e shields the other outlet (second outlet, front opening 72) of the duct 30 is preferably provided to prevent erroneous power supply to the resistors R of the load testing device 40 in a case other than the loading test.

As a power supply control unit, a second terminal unit 45f that is connected to the power generator 20 and is arranged under the load testing device 40, and that comes into contact with the load testing device 40 by biasing force in an upper direction and is electrically connected to the resistors R of the load testing device 40 when the flow channel switching plate 45e opens the other outlet (second outlet, front opening 72) of the duct 30 is considered. The power generator 20 and the load testing device 40 are electrically connected to each other via the second terminal unit 45f.

When the flow channel switching plate 45e shields the other outlet (second outlet, front opening 72) of the duct 30, the second terminal unit 45f is pushed downward by the flow channel switching plate 45e, the load testing device 40 loses contact with the second terminal unit 45f, and the electrical connection state between the power generator 20 and the load testing device 40 is released.

In order to deviate a load testing device 40 from a flow channel of cooling air from a fan 15 or to place the load testing device 40 in the flow channel and on a downstream side of a radiator 13 in a loading test, both of switching a position of the load testing device 40 with a switching device 45 (first embodiment) and changing the flow channel (second embodiment) may be performed or one thereof may be performed.

REFERENCE SIGNS LIST 1 power generation system
10 engine
11 engine main body
13 radiator
15 fan
17 emission gas tube
18 muffler
20 power generator
30 duct
40 load testing device
43 cover
45 switching device
45a actuator
45b guide
45c first terminal unit
45d position detection sensor
45e flow channel switching plate
45f second terminal unit
50 electric storage device
51 electric storage unit
53 AC/DC converter
61 control unit
62 operation unit
63 measurement unit
64 temperature sensor
65 display unit
66 communication unit
70 case
71 upper opening
72 front opening
73 side opening
74 door

The invention claimed is:

1. A power generation system comprising:
an engine including an engine main body, a radiator that performs heat exchange of cooling water flowing inside the engine main body, and a fan that cools the radiator;
a power generator that converts torque acquired in the engine main body into electricity;
a load testing device that includes a plurality of resistors and that is configured to perform a loading test of the power generator;
a flow channel of a cooling medium; and
a switching device that performs changing a relative position of the load testing device with respect to the flow channel, in order to deviate the load testing device from the flow channel or to place the load testing device in the flow channel and on a downstream side of the radiator in the loading test.

2. The power generation system according to claim 1, wherein the switching device includes a guide that holds the load testing device in a slidable state in order to change the relative position of the load testing device with respect to the flow channel.

3. The power generation system according to claim 2, further comprising a power supply control unit that keeps power supply from the power generator to the load testing device when the load testing device is placed in the flow channel and on the downstream side of the radiator and that cuts off the power supply from the power generator to the load testing device when the load testing device is deviated from the flow channel.

4. The power generation system according to claim 2, further comprising a case that houses the engine and the power generator,
wherein the load testing device and the guide are arranged on an upper part of the case, and
a cover that covers at least an upper surface of the load testing device when the load testing device is deviated from the flow channel is provided.

5. A power generation system comprising:
an engine including an engine main body, a radiator that performs heat exchange of cooling water flowing inside the engine main body, and a fan that cools the radiator;
a power generator that converts torque acquired in the engine main body into electricity;
a load testing device that includes a plurality of resistors and that is configured to perform a loading test of the power generator; and
a switching device that performs changing a flow channel of cooling air from the fan, in order to deviate the load testing device from the flow channel or to place the load testing device in the flow channel and on a downstream side of the radiator in the loading test,
wherein an outlet of the flow channel includes a first outlet not facing the load testing device and a second outlet facing the load testing device, and
the switching device includes a flow channel switching plate that shields one of the first outlet and the second outlet and that opens the other in order to change the flow channel.

6. The power generation system according to claim 5, further comprising a case that houses the engine and the power generator,
wherein the first outlet is provided in an upper opening of the case,
the second outlet is provided in a front opening of the case,
the flow channel switching plate is arranged on the upper opening in a case where the first outlet is shielded and the second outlet is opened, and
the flow channel switching plate is arranged between the front opening and the load testing device in a case where the second outlet is shielded and the first outlet is opened.

7. The power generation system according to claim 5, further comprising a power supply control unit that keeps power supply from the power generator to the load testing device when the flow channel switching plate opens the second outlet and that cuts off the power supply from the power generator to the load testing device when the flow channel switching plate shields the second outlet.

* * * * *